US007248119B2

United States Patent
Yamamoto

(10) Patent No.: US 7,248,119 B2
(45) Date of Patent: Jul. 24, 2007

(54) BROADBAND AMPLIFIER WITH IMPROVED NOISE FIGURE AND DISTORTION CHARACTERISTICS

(75) Inventor: Masaki Yamamoto, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 132 days.

(21) Appl. No.: 11/142,801

(22) Filed: Jun. 1, 2005

(65) Prior Publication Data
US 2005/0270104 A1 Dec. 8, 2005

(30) Foreign Application Priority Data
Jun. 3, 2004 (JP) .............................. 2004-165532

(51) Int. Cl.
*H03F 1/34* (2006.01)
(52) U.S. Cl. ......................................... 330/293; 330/51
(58) Field of Classification Search ..................... None
See application file for complete search history.

(56) References Cited
U.S. PATENT DOCUMENTS
5,570,065 A * 10/1996 Eberhardt et al. .......... 330/293

6,211,730 B1 * 4/2001 Fujimoto .................... 330/293

FOREIGN PATENT DOCUMENTS
JP A-8-274548 10/1996

* cited by examiner

*Primary Examiner*—Khanh Van Nguyen
(74) *Attorney, Agent, or Firm*—Brinks Hofer Gilson & Lione

(57) ABSTRACT

A broadcast transistor includes an amplifier transistor, and a negative feedback circuit connected to the amplifier transistor. A collector bias current in the amplifier transistor is switched to high and low within a range larger than a range of a current exhibiting the minimum noise figure, and the amount of feedback performed by the negative feedback circuit is changed in association with the switching of the collector bias current. When the collector bias current is switched to high, the amount of feedback becomes large; when the collector bias current is switched to low, the amount of feedback becomes small.

13 Claims, 6 Drawing Sheets

BROADBAND AMPLIFIER WITH IMPROVED NOISE FIGURE AND DISTORTION CHARACTERISTICS

This application claims the benefit of priority to Japanese Patent Application No. 2004-165532 filed on Jun. 3, 2004, herein incorporated by reference.

BACKGROUND OF THE INVENTION

1. Field of the Invention

The present invention relates to broadband amplifiers for use in, e.g., television tuners.

2. Description of the Related Art

FIG. 11 shows a broadband amplifier of the related art (see Japanese Unexamined Patent Application Publication No. 08-274548, FIG. 1). An input terminal RFin is coupled to a ground via a coupling capacitor Cin and an input resistor r1. A node a between the coupling capacitor Cin and the input resistor r1 is connected to a gate of a field-effect transistor (FET) Q1. The source of the FET Q1 is coupled to the ground via a resistor r2 or a capacitor C1. The drain of the FET Q1 is connected to an output terminal RFout via an output capacitor Cout. The drain of the FET Q1 is also connected to a drain power supply VDD via a bias choke coil L1.

A feedback resistor section 11 is connected between the node a and a node b between the drain of the FET Q1 and the bias choke coil L1. The feedback resistor section 11 includes a DC (direct current) cut capacitor C2, a PIN diode D1, a variable resistor r3, and a DC cut capacitor C3, which are connected in series from the node b. A node between the PIN diode D1 and the DC cut capacitor C2 is connected to a gain control power supply VC via a bias choke coil L2. A node between the PIN diode D1 and the variable resistor r3 is coupled to the ground via a choke coil L3.

In this structure, the resistance of the PIN diode D1 is changed by controlling the voltage of the gain control power supply VC, thereby changing the amount of feedback and therefore changing the gain. Specifically, when the voltage of the gain control power supply VC increases, the resistance of the PIN diode D1 decreases and the amount of feedback becomes large, resulting in a reduction in the gain. When the voltage of the gain control power supply VC decreases, the resistance of the PIN diode D1 increases and the amount of feedback becomes small, resulting in an increase in the gain.

The broadband amplifier shown in FIG. 11 changes only the amount of feedback to change the gain, and does not control the noise figure (NF) characteristic and the distortion characteristic depending upon the application of use.

SUMMARY OF THE INVENTION

Accordingly, it is an object of the present invention to change the gain and the NF and distortion characteristics by changing the amount of feedback and an operating point of an amplifier transistor.

A broadband amplifier according to the present invention includes an amplifier transistor, and a negative feedback circuit connected to the amplifier transistor, wherein a collector bias current in the amplifier transistor is switched to high and low within a range larger than a range of a current exhibiting the minimum NF, and the amount of feedback performed by the negative feedback circuit is changed in association with the switching of the collector bias current, the amount of feedback being large when the collector bias current is switched to high, the amount of feedback being small when the collector bias current is switched to low.

Therefore, when the collector bias current increases, the distortion is reduced and the amount of feedback becomes large, resulting in a reduction in the gain, which is suitable for amplification of strong-field television signals. When the collector bias current decreases, the NF is improved and the amount of feedback becomes small, resulting in an increase in the gain, which is suitable for amplification of weak-field television signals.

The negative feedback circuit may include an emitter bias resistor connected between an emitter of the amplifier transistor and a ground, and a first capacitor having an end connected to a node in the middle of the emitter bias resistor. The other end of the first capacitor may be coupled to the ground only when the collector bias current is switched to low.

Therefore, the amount of feedback becomes large.

A first base bias resistor connected between a base of the amplifier transistor and the ground, and a first switch transistor having a collector connected to a node in the middle of the first base bias resistor and an emitter coupled to the ground may be provided. The other end of the first capacitor may be connected to the collector of the first switch transistor.

Therefore, control of the collector bias current and the amount of feedback can be switched by turning on and off the first switch transistor.

A second base bias resistor may be connected between the collector and base of the amplifier transistor, and a second capacitor may be connected between a node in the middle of the second base bias resistor and the base of the amplifier transistor.

Therefore, the amount of feedback becomes larger.

The negative feedback circuit may include a second base bias resistor connected between a collector and base of the amplifier transistor, and a second capacitor connected between a node in the middle of the second base bias resistor and the base of the amplifier transistor. The second capacitor may have a high capacitance when the collector bias current is switched to high and may have a low capacitance when the collector bias current is switched to low.

Therefore, the amount of feedback can be changed by switching the collector bias current to high and low.

The second capacitor may be formed of a varactor diode and two capacitors connected to both ends of the varactor diode. A second switch transistor having an emitter coupled to the ground and a collector pulled up to a power supply may be provided. The varactor diode may have an anode connected to a node in the middle of the first base bias resistor via a first resistor, and a cathode connected to the collector of the second switch transistor via a second resistor. The second switch transistor may be turned on when the collector bias current is switched to high and may be turned off when the collector bias current is switched to low.

Therefore, when the second switch transistor is turned on, the capacitance of the second capacitor increases and the amount of feedback becomes large. When the second switch transistor is turned off, the capacitance of the second capacitor decreases and the amount of feedback becomes small.

The negative feedback circuit may include a second base bias resistor connected between a collector and base of the amplifier transistor, and a second capacitor connected between a node in the middle of the second base bias resistor and the base of the amplifier transistor. The second base bias resistor may have a low resistance when the collector bias current is switched to high and may have a high resistance when the collector bias current is switched to low.

Therefore, the amount of feedback can be changed by switching the collector bias current to high and low.

The second base bias resistor may include a third resistor and a fourth resistor connected to the collector and base of the amplifier transistor, the third resistor and the fourth resistor being connected in series, and a fifth resistor having an end connected to the collector of the amplifier transistor. A second switch transistor having an emitter coupled to the ground, and a switch diode having an anode connected to a node between the third resistor and the fourth resistor and a cathode connected to the second capacitor may be provided. The other end of the fifth resistor may be connected to the cathode of the switch diode, and the cathode may be connected to the collector of the second switch transistor. The second switch transistor may be turned on when the collector bias current is switched to high and may be turned off when the collector bias current is switched to low.

Therefore, when the second switch transistor is turned on, the switch diode is turned on and the resistance of the second base bias resistor becomes low, thereby increasing the amount of feedback. When the second switch transistor is turned off, the switch diode is turned off and the resistance of the second base bias resistor becomes high, thereby decreasing the amount of feedback.

A first base bias resistor connected between the base of the amplifier transistor and the ground, and a first switch transistor having a collector connected to a node in the middle of the first base bias resistor and an emitter coupled to the ground may be provided. The other end of the first capacitor may be connected to the collector of the first switch transistor, and a base of the second switch transistor may be connected to the collector of the first switch transistor.

Therefore, control of the collector bias current of the amplifier transistor and the amount of feedback performed by the two negative feedback circuits can be switched at the same time by turning on and off the first switch transistor.

A third capacitor may be connected in parallel to the emitter bias resistor.

Therefore, the frequency characteristic of the gain can be corrected for.

DESCRIPTION OF THE PREFERRED EMBODIMENTS

Figure 1:
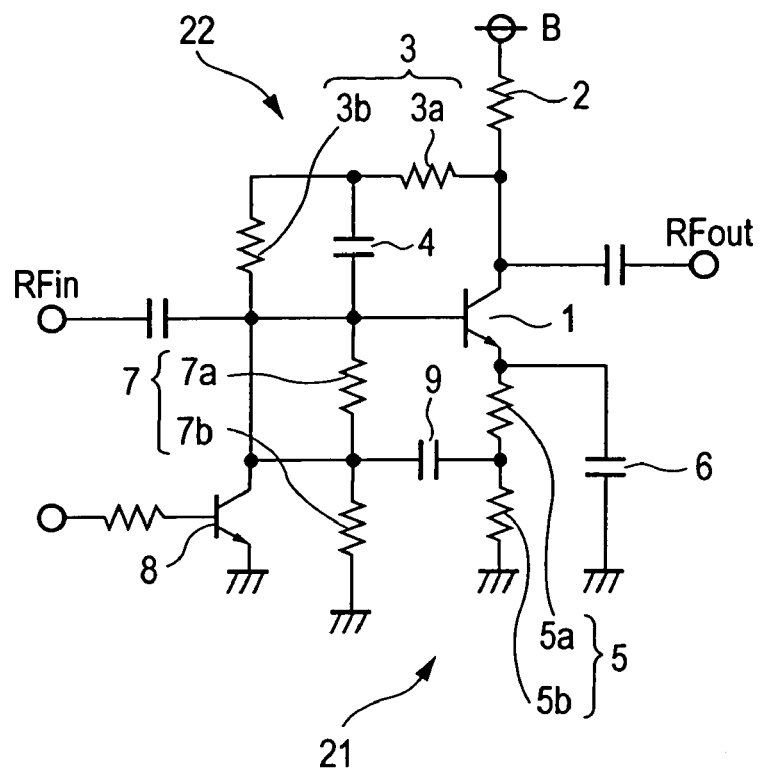
FIG. 1 is a circuit diagram of a broadband amplifier according to a first embodiment of the present invention.
Figure 2:
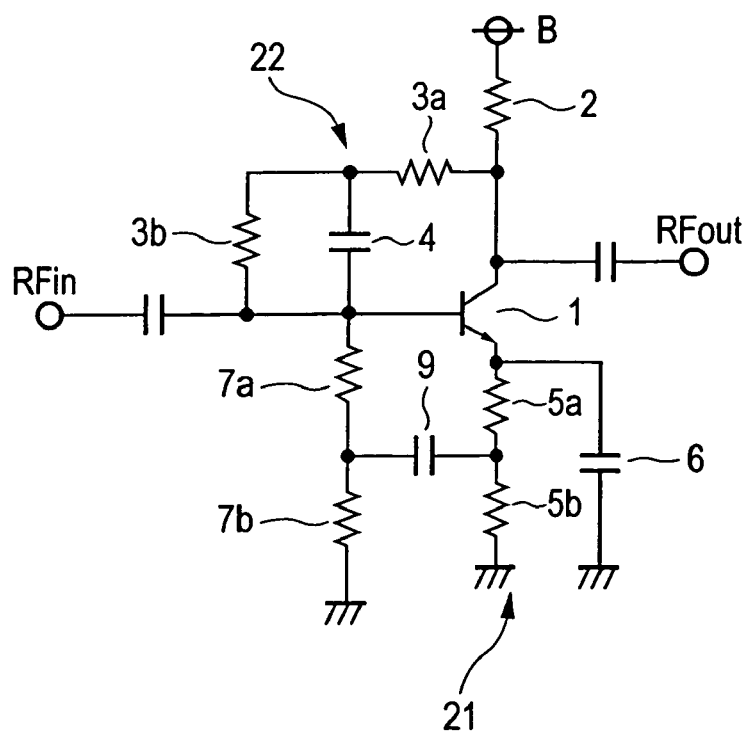
FIG. 2 is an equivalent circuit diagram of the broadband amplifier according to the first embodiment of the present invention.
Figure 3:
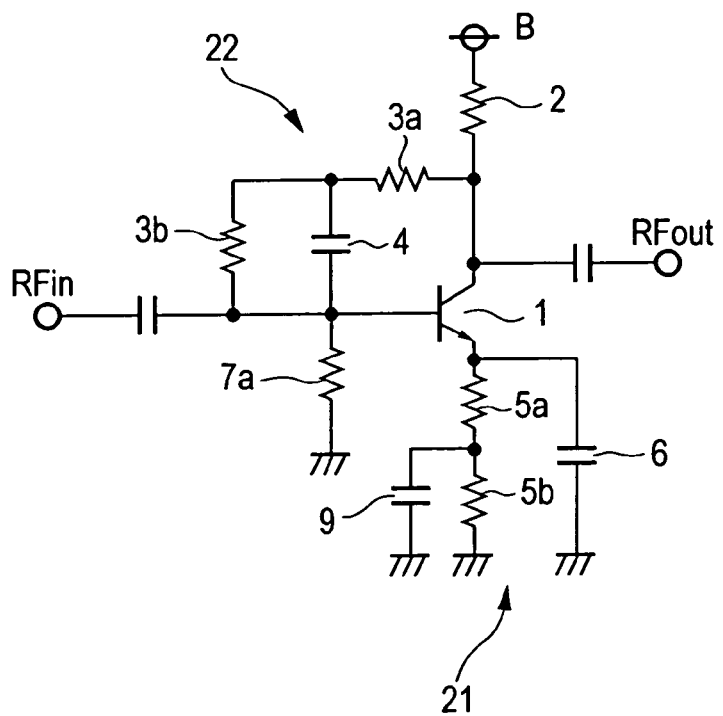
FIG. 3 is an equivalent circuit diagram of the broadband amplifier according to the first embodiment of the present invention.
Figure 4:
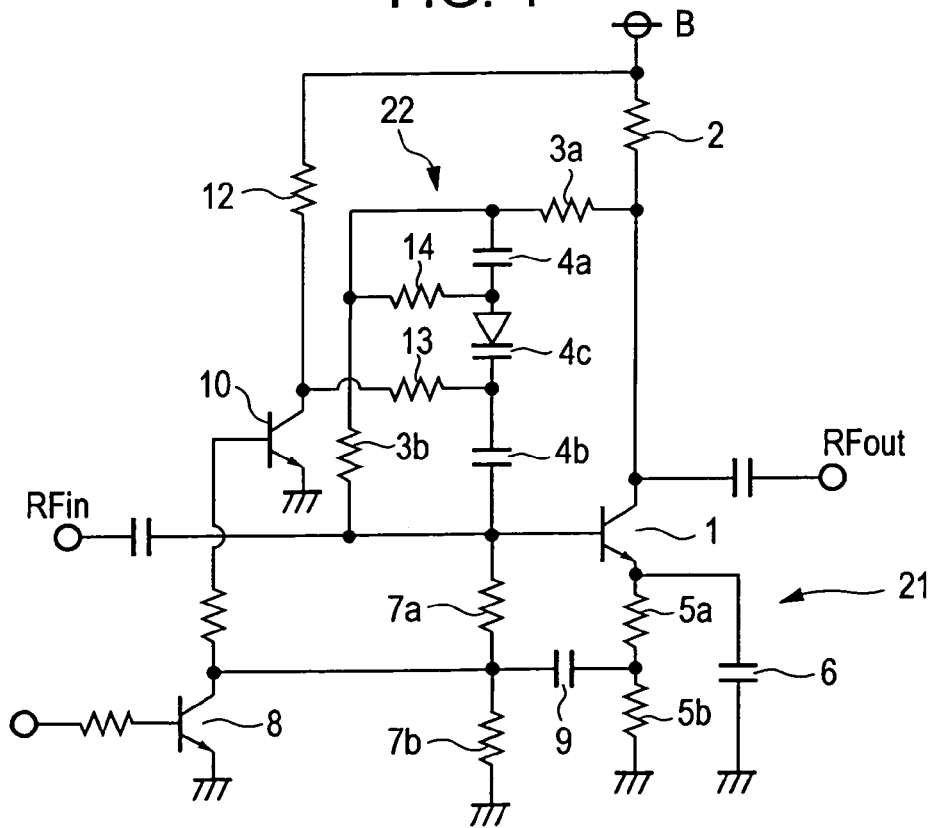
FIG. 4 is a circuit diagram of a broadband amplifier according to a second embodiment of the present invention.
Figure 5:
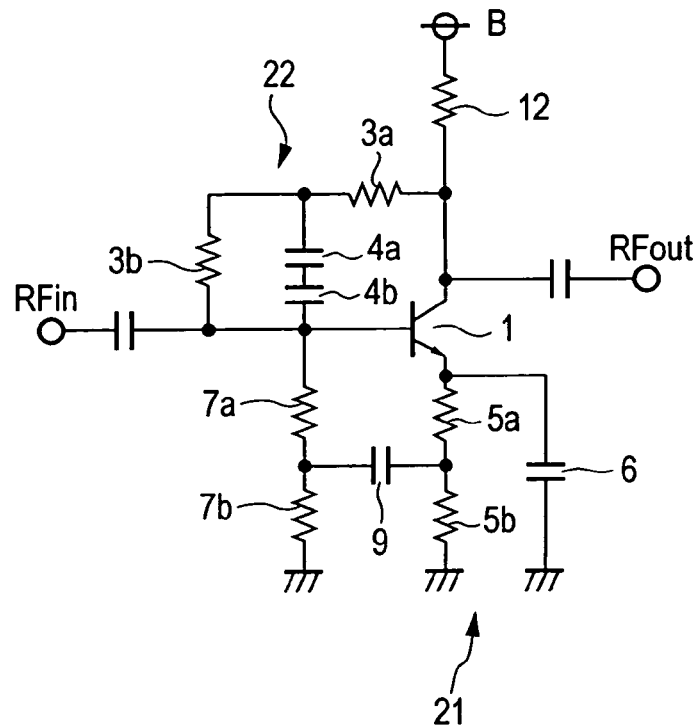
FIG. 5 is an equivalent circuit diagram of the broadband amplifier according to the second embodiment of the present invention.
Figure 6:
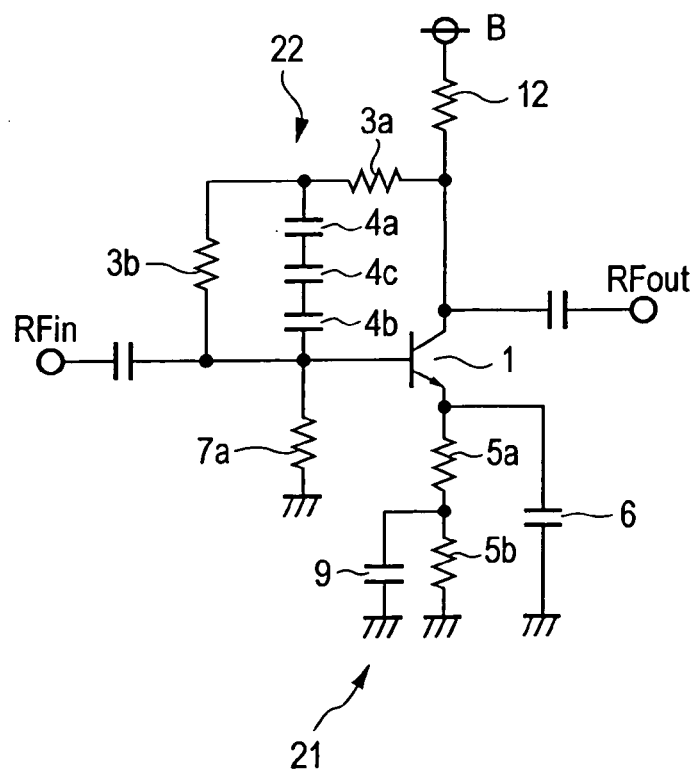
FIG. 6 is an equivalent circuit diagram of the broadband amplifier according to the second embodiment of the present invention.
Figure 7:
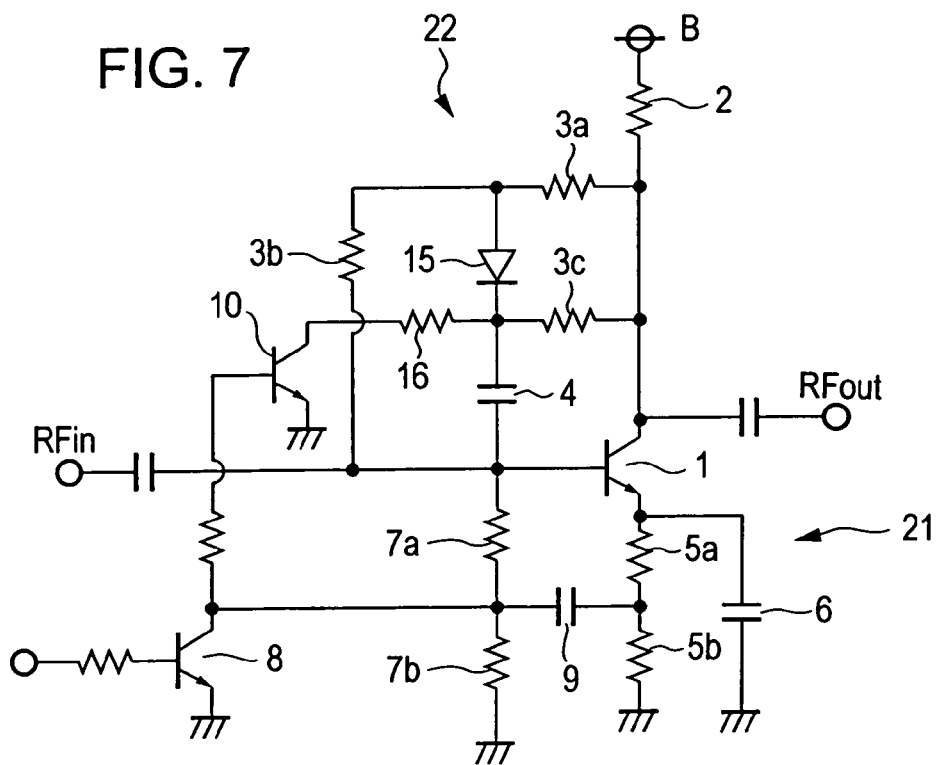
FIG. 7 is a circuit diagram of a broadband amplifier according to a third embodiment of the present invention.
Figure 8:
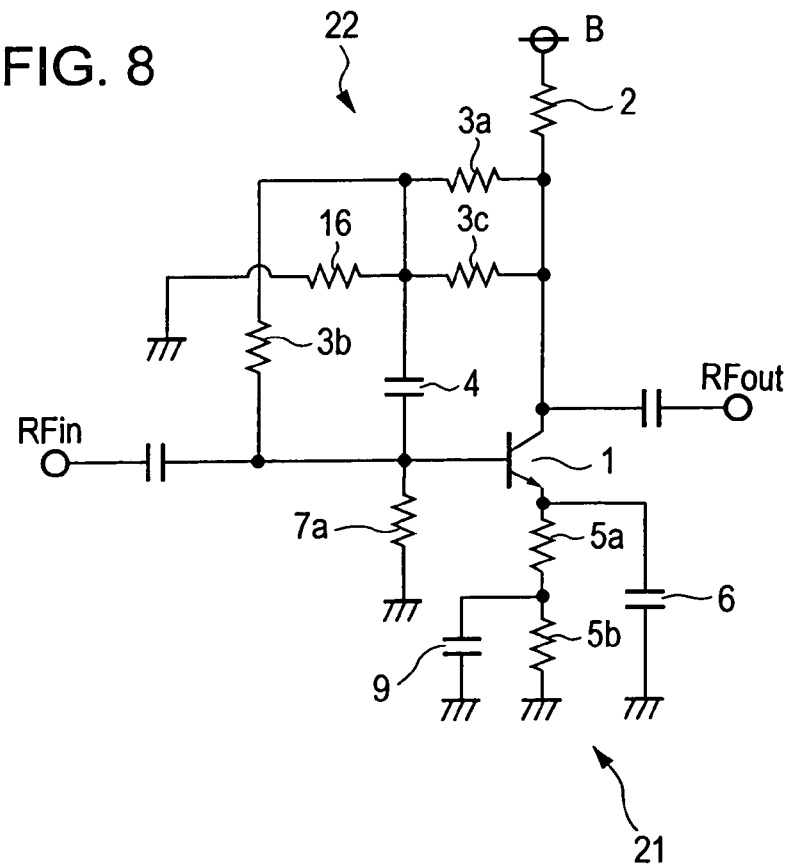
FIG. 8 is an equivalent circuit diagram of the broadband amplifier according to the third embodiment of the present invention.
Figure 9:
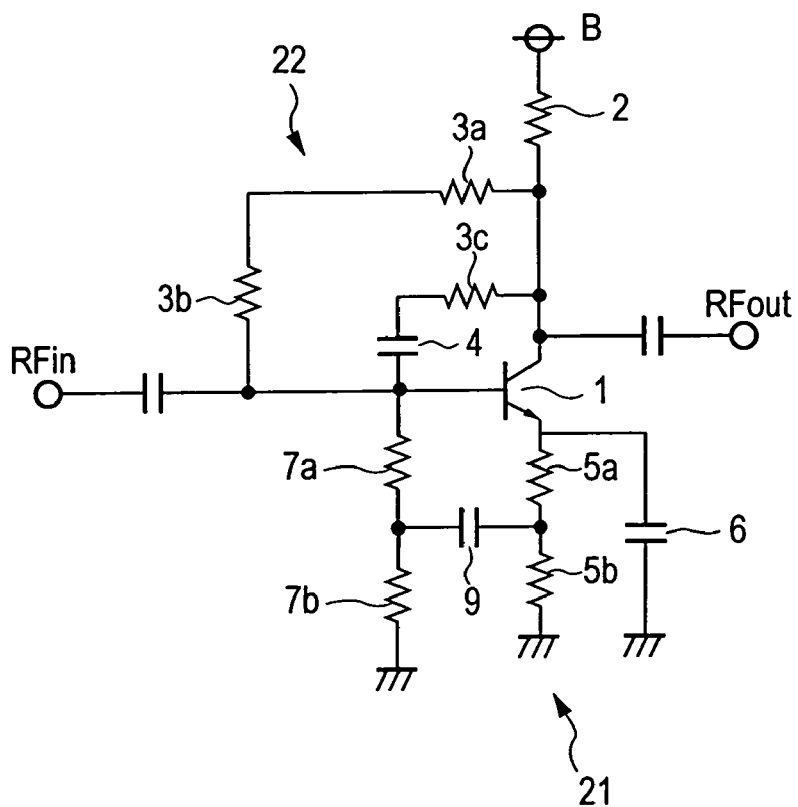
FIG. 9 is an equivalent circuit diagram of the broadband amplifier according to the third embodiment of the present invention.
Figure 10:
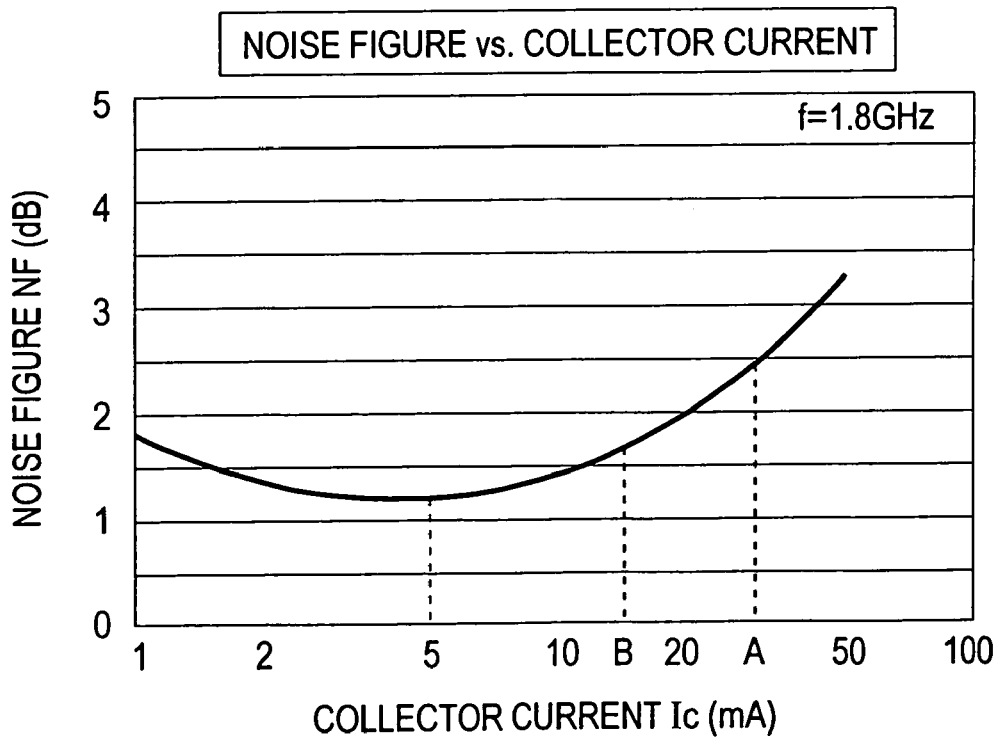
FIG. 10 is a characteristic chart of the noise figure of an amplifier transistor used in a broadband amplifier according to the present invention.

A broadband amplifier according to the present invention will be described with reference to FIGS. 1 to 10. FIG. 1 shows a broadband amplifier according to a first embodiment of the present invention, and FIGS. 2 and 3 show equivalent circuits thereof. FIG. 4 shows a broadband amplifier according to a second embodiment of the present invention, and FIGS. 5 and 6 show equivalent circuits thereof. FIG. 7 shows a broadband amplifier according to a third embodiment of the present invention, and FIGS. 8 and 9 show equivalent circuits thereof. FIG. 10 is a characteristic chart of a noise figure (NF) with respect to a collector current of an amplifier transistor used in a broadband amplifier according to the present invention.

In FIG. 1, an amplifier transistor 1 has a base connected to an input terminal RFin, and a collector connected to an output terminal RFout. The collector of the amplifier transistor 1 is pulled up to a power supply B by a load resistor 2. A second base bias resistor 3 (including a first resistor 3a and a second resistor 3b, which are connected in series) is connected between the collector and base of the amplifier transistor 1. A node in the middle of the second base bias resistor 3 (or a node between the first resistor 3a and the second resistor 3b) is connected to the base of the amplifier transistor 1 via a second capacitor 4. Thus, the second base bias resistor 3 and the second capacitor 4 form a second negative feedback circuit 22.

An emitter of the amplifier transistor 1 is coupled to a ground via an emitter bias resistor 5 (including resistors 5a and 5b connected in series). The emitter of the amplifier transistor 1 is also coupled to the ground via a third capacitor 6. Since the third capacitor 6 does not function as a bypass capacitor, the emitter bias resistor 5 and the third capacitor 6 form a first negative feedback circuit 21.

The base of the amplifier transistor 1 is coupled to the ground via a first base bias resistor 7 (including resistors 7a and 7b connected in series). A node in the middle of the first base bias resistor 7 (or a node between the resistors 7a and 7b) is connected to a collector of a first switch transistor 8 whose emitter is coupled to the ground. A first capacitor 9 is connected between a node in the middle of the emitter bias resistor 5 (or a node between the resistors 5a and 5b) and the collector of the first switch transistor 8. The first capacitor 9 also forms a portion of the first feedback circuit 21. A switching voltage is input to a base of the first switch transistor 8 to turn on and off the first switch transistor 8.

FIG. 10 is a characteristic chart of the noise figure (NF) with respect to a collector current in the amplifier transistor 1. In this characteristic chart, the optimum (or minimum) NF is exhibited at a collector current of about 5 mA. The NF becomes worse at a collector current higher or lower than 5 mA. In view of the gain and the distortion, the collector current is generally biased so as to be 10 mA or higher.

Figure 11:
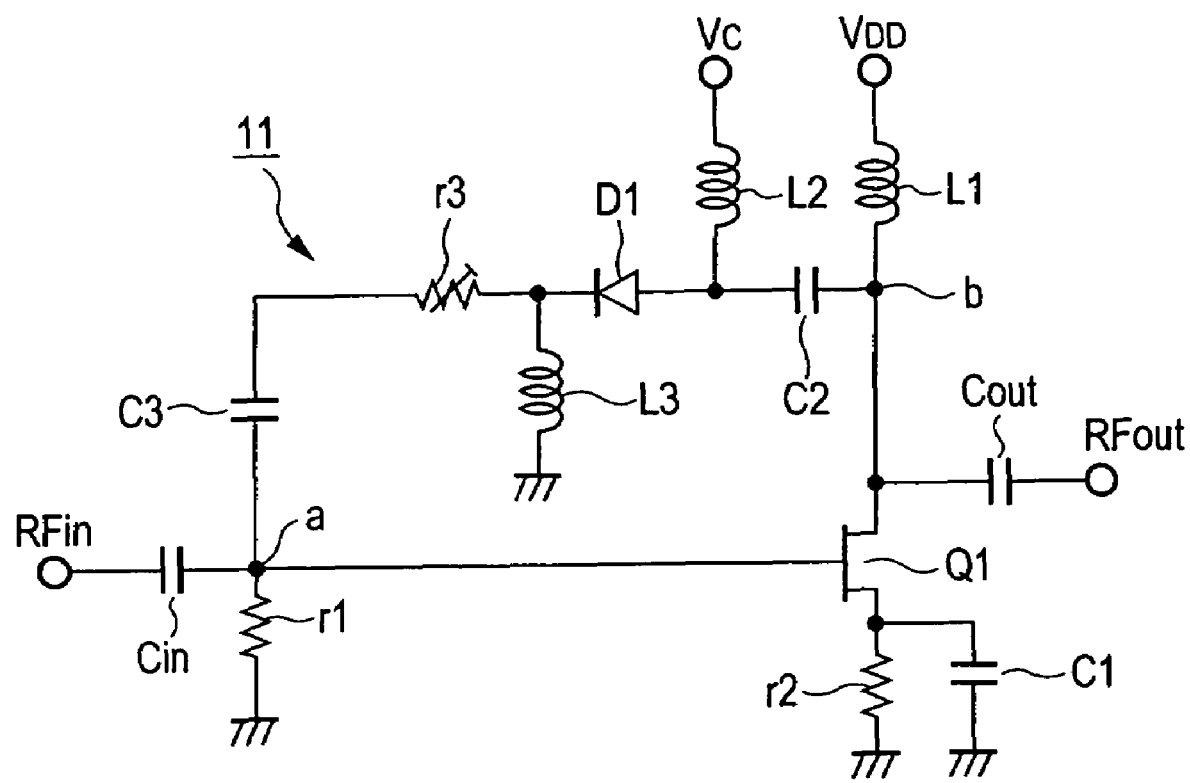
FIG. 11 is a circuit diagram of a broadband amplifier of the related art.

FIG. 2 shows an equivalent circuit of the broadband amplifier shown in FIG. 1 when the first switch transistor 8 is turned off. In this state, a collector bias current equal to the collector bias current at the node a shown in FIG. 11 (e.g., 20 mA or higher) flows in the amplifier transistor 1. The second base bias resistor 3 and the second capacitor 4 between the collector and the base of the amplifier transistor 1 provide negative feedback, and the emitter bias resistor 5 and the third capacitor 6 provide negative feedback.

FIG. 3 shows an equivalent circuit of the broadband amplifier shown in FIG. 1 when the first switch transistor 8 is turned on. In this state, the base is coupled to the ground via a portion of the first base bias resistor 7 (i.e., the resistor 7a), and a collector bias current equal to the collector bias current at the node b shown in FIG. 11 (e.g., 20 mA or lower, higher than 5 mA) flows in the amplifier transistor 1 (the collector bias current in this state is lower than the state shown in FIG. 2). The second base bias resistor 3 and the second capacitor 4 between the collector and the base of the amplifier transistor 1 provide negative feedback, and the emitter bias resistor 5, the first capacitor 9, and the third capacitor 6 provide negative feedback.

Comparing the circuits shown in FIGS. 2 and 3, the circuit shown in FIG. 2 allows lower distortion because a high collector bias current flows. In the circuit shown in FIG. 2, the impedance between the emitter of the amplifier transistor 1 and the ground becomes low because of a parallel connection between the first capacitor 9 and a portion of the emitter bias resistor 5 (i.e., the resistor 5b). Therefore, the amount of feedback becomes large and the gain is low.

On the other hand, the circuit shown in FIG. 3 improves the NF because a low collector bias current flows. The amount of feedback at the emitter of the amplifier transistor 1 becomes small and the gain is high.

Therefore, the circuit shown in FIG. 2 is suitable for amplification of strong-field television signals, and the circuit shown in FIG. 3 is suitable for amplification of television signals in a weak or medium electric field.

FIG. 4 shows a broadband amplifier according to a second embodiment of the present invention. In this broadband amplifier, the second capacitor 4 is formed of two capacitors 4a and 4b and a varactor diode 4c connected therebetween. The broadband amplifier shown in FIG. 4 further includes a second switch transistor 10 that is controlled by the first switch transistor 8. The second switch transistor 10 has an emitter coupled to the ground, a base connected to the collector of the first switch transistor 8, and a collector pulled up to the power supply B by a resistor 12. The collector of the second switch transistor 10 is connected to the cathode of the varactor diode 4c by a second resistor 13. The anode of the varactor diode 4c is connected to the node in the middle of the second base bias resistor 3 via a first resistor 14.

In this structure, the second switch transistor 10 is turned on when the first switch transistor 8 is turned off, and, conversely, the second switch transistor 10 is turned off when the first switch transistor 8 is turned on. FIG. 5 shows an equivalent circuit of the broadband amplifier shown in FIG. 4 when the first switch transistor 8 is turned off and the second switch transistor 10 is turned on. In this state, the varactor diode 4c is forward biased and is turned on. Thus, the second capacitor 4 is formed of only the two capacitors 4a and 4b. FIG. 6 shows an equivalent circuit of the broadband amplifier shown in FIG. 4 when the first switch transistor 8 is turned on and the second switch transistor 10 is turned off. In this state, the varactor diode 4c is reverse biased. Thus, the second capacitor 4 is formed of a series circuit of the two capacitors 4a and 4b and the varactor diode 4c. Therefore, the circuit shown in FIG. 6 provides a smaller amount of feedback than the circuit shown in FIG. 5, resulting in higher gain, which is suitable for amplification of weak- or medium-field television signals.

In the broadband amplifier according to the third embodiment of the present invention shown in FIG. 7, the structure of the second feedback circuit 22 is different from that shown in FIG. 4. The second base bias resistor 3 includes a third resistor 3a connected to the collector of the amplifier transistor 1, a fourth resistor 3b connected to the third resistor 3a in series and connected to the base of the amplifier transistor 1, and a fifth resistor 3c having an end connected to the collector of the amplifier transistor 1. A switch diode 15 has an anode connected to a node between the third resistor 3a and the fourth resistor 3b, and a cathode connected to the second capacitor 4.

The other end of the fifth resistor 3c is connected to a node between the cathode of the switch diode 15 and the second capacitor 4. This node is connected to a collector of the second switch transistor 10 via a sixth resistor 16. The second switch transistor 10 has an emitter coupled to the ground, and a base connected to the collector of the first switch transistor 8. Other structure is the same as that shown in FIG. 4.

In the circuit shown in FIG. 7, the on/off operations of the first switch transistor 8 and the second switch transistor 10 are also opposite to each other. When the first switch transistor 8 is turned off and the second switch transistor 10 is turned on, the switch diode 15 is turned on to form an equivalent circuit shown in FIG. 8, in which the second feedback circuit 22 is the same as that shown in FIGS. 2 and 5. Therefore, the gain is low.

The collector bias current in the amplifier transistor 1 is high and the distortion characteristic is improved. In the second feedback circuit 22, the third resistor 3a and the fifth resistor 3c are connected in parallel, and the second capacitor 4 is connected between the base of the amplifier transistor 1 and nodes between the fourth resistor 3b and the third and fifth resistors 3a and 3c. Thus, the amount of feedback becomes large and the gain is low, which is suitable for amplification of television signals in a strong electric field.

When the first switch transistor 8 is turned on and the second switch transistor 10 is turned off, the switch diode 15 is turned off to form an equivalent circuit shown in FIG. 9, in which the second feedback circuit 22 is the same as that shown in FIGS. 3 and 6. Therefore, the gain is high. The collector bias current in the amplifier transistor 1 is low and the NF is improved. Moreover, the amount of feedback performed by the second feedback circuit 22 becomes small and the gain is high. This circuit is therefore suitable for amplification of television signals in a weak electric field.

What is claimed is:

1. A broadband amplifier comprising:
   an amplifier transistor; and
   a negative feedback circuit connected to the amplifier transistor,
   wherein a collector bias current value in the amplifier transistor is switched to a high current value and a low current value within a range of a current value larger than a value of a current exhibiting a minimum noise figure, and an amount of feedback performed by the negative feedback circuit is changed in association with the switching of the collector bias current, the amount of feedback being large when the collector bias current is switched to high, the amount of feedback being small when the collector bias current is switched to low.

2. The broadband amplifier according to claim 1, wherein the negative feedback circuit includes an emitter bias resistor connected between an emitter of the amplifier transistor and a ground, and first capacitor means having an end connected to a node in a middle of the emitter bias resistor, and the other end of the first capacitor means is coupled to the ground only when the collector bias current is switched to low.

3. The broadband amplifier according to claim 2, wherein a first base bias resistor connected between a base of the amplifier transistor and the ground, and a first switch transistor having a collector connected to a node in a middle of the first base bias resistor and an emitter coupled to the ground are provided, and the other end of the first capacitor means is connected to the collector of the first switch transistor.

4. The broadband amplifier according to claim 2, wherein a second base bias resistor is connected between the collector and base of the amplifier transistor, and second capacitor means is connected between a node in a middle of the second base bias resistor and the base of the amplifier transistor.

5. The broadband amplifier according to claim 1, wherein the negative feedback circuit includes a second base bias resistor connected between a collector and base of the amplifier transistor, and second capacitor means connected between a node in a middle of the second base bias resistor and the base of the amplifier transistor, and the second capacitor means has a high capacitance when the collector bias current is switched to high, and has a low capacitance when the collector bias current is switched to low.

6. The broadband amplifier according to claim 5, wherein the second capacitor means is formed of a varactor diode and two capacitors connected to both ends of the varactor diode, a second switch transistor having an emitter coupled to the ground and a collector pulled up to a power supply is provided, the varactor diode has an anode connected to a node in a middle of the first base bias resistor via a first resistor, and a cathode connected to the collector of the second switch transistor via a second resistor, and the second switch transistor is turned on when the collector bias current is switched to high and is turned off when the collector bias current is switched to low.

7. The broadband amplifier according to claim 1, wherein the negative feedback circuit includes a second base bias resistor connected between a collector and base of the amplifier transistor, and second capacitor means connected between a node in a middle of the second base bias resistor and the base of the amplifier transistor, and the second base bias resistor has a low resistance when the collector bias current is switched to high, and has a high resistance when the collector bias current is switched to low.

8. The broadband amplifier according to claim 7, wherein the second base bias resistor includes a third resistor and a fourth resistor connected to the collector and base of the amplifier transistor, the third resistor and the fourth resistor being connected in series, and a fifth resistor having an end connected to the collector of the amplifier transistor, a second switch transistor having an emitter coupled to the ground, and a switch diode having an anode connected to a node between the third resistor and the fourth resistor and a cathode connected to the second capacitor means are provided, the other end of the fifth resistor is connected to the cathode of the switch diode, the cathode being connected to the collector of the second switch transistor, and the second switch transistor is turned on when the collector bias current is switched to high and is turned off when the collector bias current is switched to low.

9. The broadband amplifier according to claim 6, wherein a first base bias resistor connected between the base of the amplifier transistor and the ground, and a first switch transistor having a collector connected to a node in the middle of the first base bias resistor and an emitter coupled to the ground are provided, and an end of first capacitor means is connected to the collector of the first switch transistor and a base of the second switch transistor is connected to the collector of the first switch transistor.

10. The broadband amplifier according to claim 2, wherein third capacitor means is connected in parallel to the emitter bias resistor.

11. The broadband amplifier according to claim 8, wherein a first base bias resistor connected between the base of the amplifier transistor and the ground, and a first switch transistor having a collector connected to a node in a middle of the first base bias resistor and an emitter coupled to the ground are provided, and the other end of the first capacitor means is connected to the collector of the first switch transistor and a base of the second switch transistor is connected to the collector of the first switch transistor.

12. The broadband amplifier according to claim 5, wherein third capacitor means is connected in parallel to the emitter bias resistor.

13. The broadband amplifier according to claim 7, wherein third capacitor means is connected in parallel to the emitter bias resistor.

* * * * *